(12) United States Patent
Kang

(10) Patent No.: US 11,296,702 B1
(45) Date of Patent: Apr. 5, 2022

(54) SIGNAL TRANSMISSION CIRCUIT OF A SEMICONDUCTOR DEVICE

(71) Applicant: SK hynix Inc., Icheon-si Gyeonggi-do (KR)

(72) Inventor: Ji Hyo Kang, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/170,532

(22) Filed: Feb. 8, 2021

(30) Foreign Application Priority Data

Sep. 15, 2020 (KR) .......................... 10-2020-0118094

(51) Int. Cl.
*H03K 19/0185* (2006.01)

(52) U.S. Cl.
CPC .............. *H03K 19/018521* (2013.01); *H03K 19/018571* (2013.01)

(58) Field of Classification Search
None
See application file for complete search history.

(56) References Cited

U.S. PATENT DOCUMENTS

| 4,187,477 | A | 2/1980 | Endoh et al. |
| 8,674,747 | B2 | 3/2014 | Iwasaki |
| 2020/0304114 | A1* | 9/2020 | Arai ........................ H03M 9/00 |

* cited by examiner

*Primary Examiner* — Jany Richardson
(74) *Attorney, Agent, or Firm* — William Park & Associates Ltd.

(57) ABSTRACT

A signal transmission circuit of a semiconductor device includes a first emphasis circuit and a second emphasis circuit. The first emphasis circuit feeds a signal of an output node back to an input node. The first emphasis circuit may perform a first emphasis operation on a signal of the input node and the signal of the output node by adjusting a feedback time of the first emphasis circuit. The second emphasis circuit may be connected in parallel with the first emphasis circuit to perform a feedback of the signal of the output node to the input node. The second emphasis circuit may perform a second emphasis operation on the signal of the input node and the signal of the output node by adjusting a feedback time of the second emphasis circuit.

17 Claims, 5 Drawing Sheets

SIGNAL TRANSMISSION CIRCUIT OF A SEMICONDUCTOR DEVICE

CROSS-REFERENCES TO RELATED APPLICATION

The present application claims priority under 35 U.S.C. § 119(a) to Korean application number 10-2020-0118094, filed on Sep. 15, 2020, in the Korean Intellectual Property Office, which is incorporated herein by reference in its entirety.

BACKGROUND

1. Technical Field

Various embodiments may generally relate to a semiconductor circuit, and may more particularly relate to a signal transmission circuit of a semiconductor device.

2. Related Art

Referring to FIG. 1, a conventional signal transmission circuit of a semiconductor device may include a plurality of inverters, for example, a first inverter 11 and a second inverter 12.

The number of inverters may be changed in accordance with signal phases and driving capacity.

The first inverter 11 and the second inverter 12 may be connected between a first load, i.e., a pre-stage, and a second load, i.e., a next stage.

The first inverter 11 and the second inverter 12 may repeatedly invert an output signal of the pre-stage. The first inverter 11 and the second inverter 12 may then transmit the output signal to the next stage.

The pre-stage may include a circuit configured to receive data Data_in in accordance with a clock signal.

The pre-stage may have a stack structure. The pre-stage may include a multiplexer, a latch, a flip-flop, and various logic gates configured to serialize the data parallelly inputted into the pre-stage so that a loading may be increased.

Therefore, inter-symbol interference (ISI) may be generated due to the circuit structure such as the pre-stage having the high loading. As a result, a timing margin may be decreased due to jitter caused by the ISI and a decreasing of a swing width of the output signal.

The timing margin may be further decreased due to the decreasing of the swing width in proportion to increasing an operational frequency of a corresponding system.

SUMMARY

Example embodiments may provide a signal transmission circuit of a semiconductor device that may be capable of improving signal transmission capacity.

In example embodiments of the present disclosure, a signal transmission circuit of a semiconductor device may include a first emphasis circuit and a second emphasis circuit. The first emphasis circuit is configured to feed back a signal of an output node of the first emphasis circuit to an input node of the first emphasis circuit. The first emphasis circuit is configured to perform a first emphasis operation with respect to a signal of the input node of the first emphasis circuit and the signal of the output node of the first emphasis circuit by adjusting a feedback time of the first emphasis circuit. The second emphasis circuit is connected in parallel with the first emphasis circuit between the input node and the output node. The second emphasis circuit is configured to feed back the signal of the output node to the input node. The second emphasis circuit is configured to perform a second emphasis operation with respect to the signals of the input node and the output node by adjusting a feedback time of the second emphasis circuit.

In example embodiments of the present disclosure, a signal transmission circuit of a semiconductor device may include a first emphasis circuit and a second emphasis circuit. The first emphasis circuit is configured to feed back a signal of an output node of the first emphasis circuit to an input node of the first emphasis circuit. The first emphasis circuit is configured to perform a first emphasis operation with respect to a signal of the input node of the first emphasis circuit and the signal of the output node of the first emphasis circuit by adjusting a feedback time of the first emphasis circuit. The second emphasis circuit has an input node connected to the input node of the first emphasis circuit. The second emphasis circuit is configured to feed back a signal of an output node of the second emphasis circuit to the input node of the second emphasis circuit. The second emphasis circuit is configured to perform a second emphasis operation with respect to the signal of the input node of the second emphasis circuit by adjusting a feedback time of the second emphasis circuit.

In example embodiments of the present disclosure, a signal transmission circuit of a semiconductor device may include an emphasis circuit and a delay circuit. The emphasis circuit may perform an emphasis operation on a signal of an output node and a signal of an input node by performing a feedback of the signal of the output node and/or the signal of the input node to an input node. The delay circuit may be configured to delay a feedback time by the emphasis circuit.

According to example embodiments, the signal transmission circuit of the semiconductor device may have improved signal transmission capacity.

BRIEF DESCRIPTION OF THE DRAWINGS

The above and another aspects, features, and advantages of the subject matter of the present disclosure will be more clearly understood from the following detailed description taken in conjunction with the accompanying drawings, in which.

DETAILED DESCRIPTION

Various embodiments of the present teachings will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments. However, the described embodiments of the present teachings should not be construed as limiting the inventive concept. Although a few embodiments of the present teachings are shown and described, it will be appreciated by those of ordinary skill in the art that changes may be made to these embodiments without departing from the principles and spirit of the present teachings.

Figure 1:
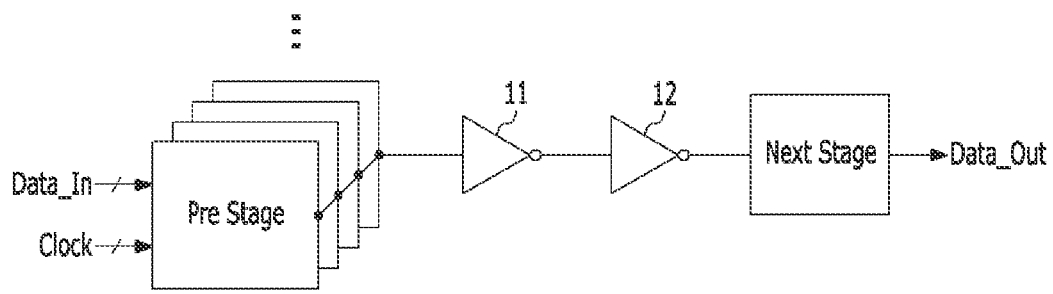
FIG. 1 is a diagram illustrating a conventional signal transmission circuit.
Figure 2:
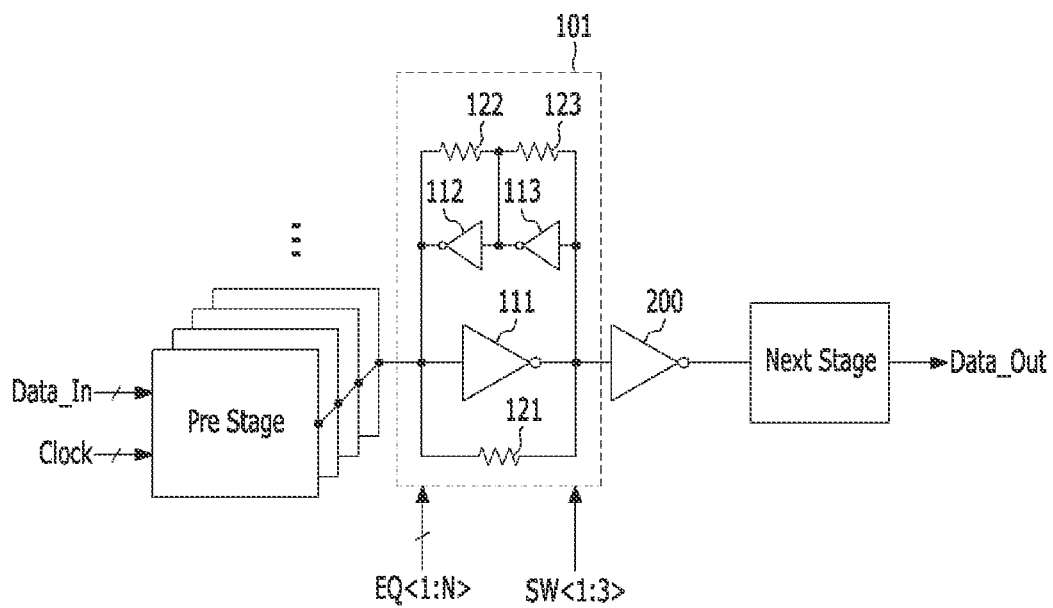
FIG. 2 is a diagram illustrating a signal transmission circuit in accordance with an embodiment of the present disclosure.

FIG. 2 is a view illustrating a signal transmission circuit in accordance with example embodiments.

Referring to FIG. 2, a signal transmission circuit 101 may be connected between a first load and a second load. The first load may include a pre-stage. The second load may include a next stage.

The signal transmission circuit 101 may include a plurality of buffer units and a plurality of resistances. For example, the buffer units may include first to third buffer units 111-113. The resistances may include first to third resistances 121-123.

At least one of the first to third buffer units 111-113 may have an adjustable driving force by a driving force control signal EQ<1:N>.

An intensity of an emphasis operation may be controlled by adjusting the driving force of the at least one of the first to third buffer units 111-113.

The driving force of the first buffer unit 111 may be greater than the driving forces of the second and third buffer units 112 and 113.

The driving forces of the second buffer unit 112 and/or the third buffer unit 113 may be changed. A maximum driving force of the second buffer unit 112 and/or the third buffer unit 113 may be less than a default driving force of the first buffer unit 111.

At least one of the first to third resistances 121-123 may be connected or disconnected with/from a corresponding signal path by a switching control signal SW<1:3>.

At least one of the first to third resistances 121-123 may be connected or disconnected with/from the corresponding signal path to adjust a feedback time.

Values of the driving force control signal EQ<1:N> and the switching control signal SW<1:3> may be determined in accordance with operational characteristics of the signal transmission circuit 101. The values of the driving force control signal EQ<1:N> and the switching control signal SW<1:3> may be changed for needs.

The driving force control signal EQ<1:N> and the switching control signal SW<1:3> may be programmed in a non-volatile storage device, for example, a fuse set.

The driving force control signal EQ<1:N> and the switching control signal SW<1:3> may be stored in a mode register set of a semiconductor device. The values of the driving force control signal EQ<1:N> and the switching control signal SW<1:3> may be changed by a mode register write operation.

The first buffer unit 111 may be connected between an input node of the signal transmission circuit 101 (hereinafter, referred to as an input node) and an output node of the signal transmission circuit 101 (hereinafter, referred to as an output node).

The second buffer unit 112 and the third buffer unit 113 may be connected between the input node and the output node in parallel with the first buffer unit 111.

The second buffer unit 112 may include an output terminal connected to the input node.

The third buffer unit 113 may include an output terminal connected to an input terminal of the second buffer unit 112 and an input terminal connected to the output node.

The first resistance 121 may be connected with the first buffer unit 111 in parallel.

The second resistance 122 may be connected with the second buffer unit 112 in parallel.

The third resistance 123 may be connected with the third buffer unit 113 in parallel.

The first buffer unit 111 and the first resistance 121 may form a first feedback loop configured to perform a feedback of the signal of the output node to the input node.

The second buffer unit 112, the third buffer unit 113, the second resistance 122, and the third resistance 123 may form a second feedback loop configured to perform a feedback of the signal of the output node to the input node.

Because each of the first to third resistances 121-123 may be connected with the first to third buffer units 111-113 in parallel, bandwidths of the input node and the output node in the signal transmission circuit 101 may be increased.

The first to third buffer units 111-113 and the first to third resistances 121-123 may be classified into an emphasis circuit and a delay circuit.

The emphasis circuit may perform an emphasis operation with respect to the signals of the input node and the output node by performing the feedback of the signal of the output node to the input node.

The emphasis circuit may include the first to third buffer units 111-113.

The delay circuit may be configured to control the feedback time by the emphasis circuit.

The delay circuit may include the first to third resistances 121-123.

The signal transmission circuit 101 may include the two feedback loops to perform the double emphasis operations. Thus, the first to third buffer units 111-113 and the first to third resistances 121-123 may be divided into a first emphasis circuit and a second emphasis circuit.

The first emphasis circuit may perform a feedback of the signal of the output node to the input node using a first feedback loop. The first emphasis circuit may perform a first emphasis operation with respect to the signals of the input node and the output node by adjusting the feedback time.

The first emphasis circuit may include the first buffer unit 111 and the first resistance 121.

The second emphasis circuit may be connected in parallel with the first emphasis circuit. The second emphasis circuit may perform a feedback of the signal of the output node to the input node using a second feedback loop. The second emphasis circuit may perform a second emphasis operation with respect to the signals of the input node and the output node by adjusting the feedback time.

The second emphasis circuit may include the second buffer unit 112, the third buffer unit 113, the second resistance 122, and the third resistance 123.

An output of the signal transmission circuit 101 may be transmitted to the next stage via at least one buffer 200.

Numbers of the buffer 200 may be changed in accordance with phases of the output signal from the signal transmission circuit 101, a driving capacity of the signal transmission circuit 101, etc.

Figure 5:
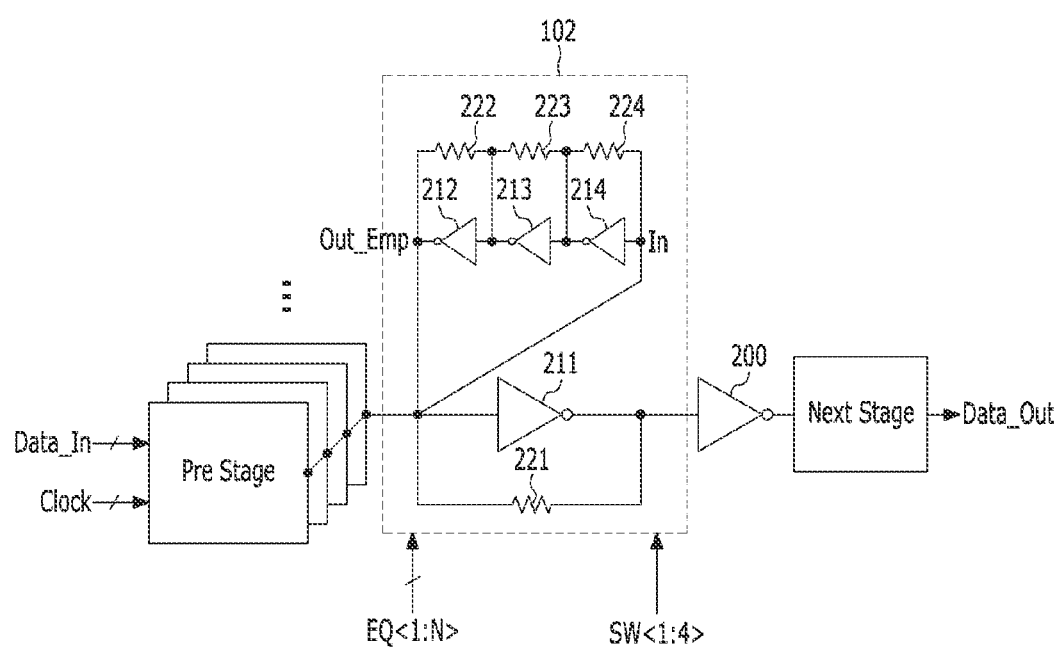
FIG. 5 is a diagram illustrating a signal transmission circuit in accordance with an embodiment of the present disclosure.

The buffer 200 may include an inverter configured to invert the input signal. Alternatively, the buffer 200 may have a configuration substantially the same as that of the signal transmission circuit 101 or a signal transmission circuit 102 in FIG. 5 illustrated later.

Figure 3:
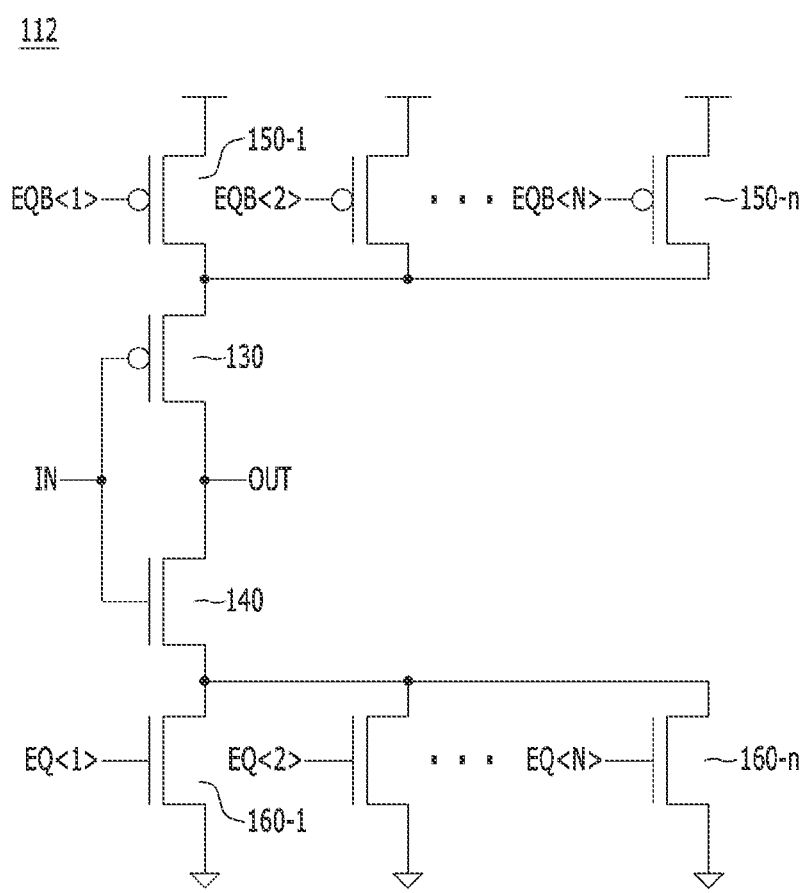
FIG. 3 is a diagram illustrating a second buffer unit in FIG. 2.

FIG. 3 is a view illustrating a second buffer unit in FIG. 2.

Referring to FIG. 3, the second buffer unit 112 may include a plurality of PMOS transistors 130 and 150-1~150-n and a plurality of NMOS transistors 140 and 160-1~160-n.

The PMOS transistor 130 may include a gate connected to an input terminal IN and a drain connected to an output terminal OUT.

Each of the PMOS transistors 150-1~150-n may include a source connected to a power terminal, a gate into which signals EQB<1:N> generated by inverting the driving force control signal EQ<1:N> may be inputted, and a drain commonly connected to a source of the PMOS transistor 130.

The NMOS transistor 140 may include a gate connected to the input terminal IN and a drain connected to the output terminal OUT.

Each of the NMOS transistors 160-1~160-n may include a source connected to a ground terminal, a gate into which the driving force control signal EQ<1:N> may be inputted, and a drain connected to a source of the NMOS transistor 140.

The driving force of the second buffer unit 112 may be increased in proportion to increasing a signal bit having '1' among signal bits of the driving force control signal EQ<1:N>. In contrast, the driving force of the second buffer unit 112 may be decreased in proportion to decreasing the signal bit having '1' among the signal bits of the driving force control signal EQ<1:N>.

When only one of the signal bits of the driving force control signal EQ<1:N> may have '1', for example, EQ<1> among EQ<1:N> may have '1', only the PMOS transistor 150-1 among the PMOS transistors 150-1~150-n and only the NMOS transistor 160-1 among the NMOS transistors 160-1~160-n may be turned-on so that the driving force of the second buffer unit 112 may have a minimum value.

When all of the signal bits of the driving force control signal EQ<1:N> may have '1', all of the PMOS transistors 150-1~150-n and all of the NMOS transistors 160-1~160-n may be turned-on so that the driving force of the second buffer unit 112 may have a maximum value.

When all of the signal bits of the driving force control signal EQ<1:N> may have '0', all of the PMOS transistors 150-1~150-n and all of the NMOS transistors 160-1~160-n may be turned-off. Because all of the PMOS transistors 150-1~150-n and all of the NMOS transistors 160-1~160-n may be turned-off, a current source path toward the PMOS transistor 130 and a current sinking path from the NMOS transistor 140 may be blocked to stop the operations of the second buffer unit 112.

The third buffer unit 113 may have a circuit configuration substantially the same as that of the second buffer unit 112.

The intensity of the emphasis operation may be adjusted in accordance with the adjustment of the driving force of the second buffer unit 112 and/or the third buffer unit 113.

Figure 4:
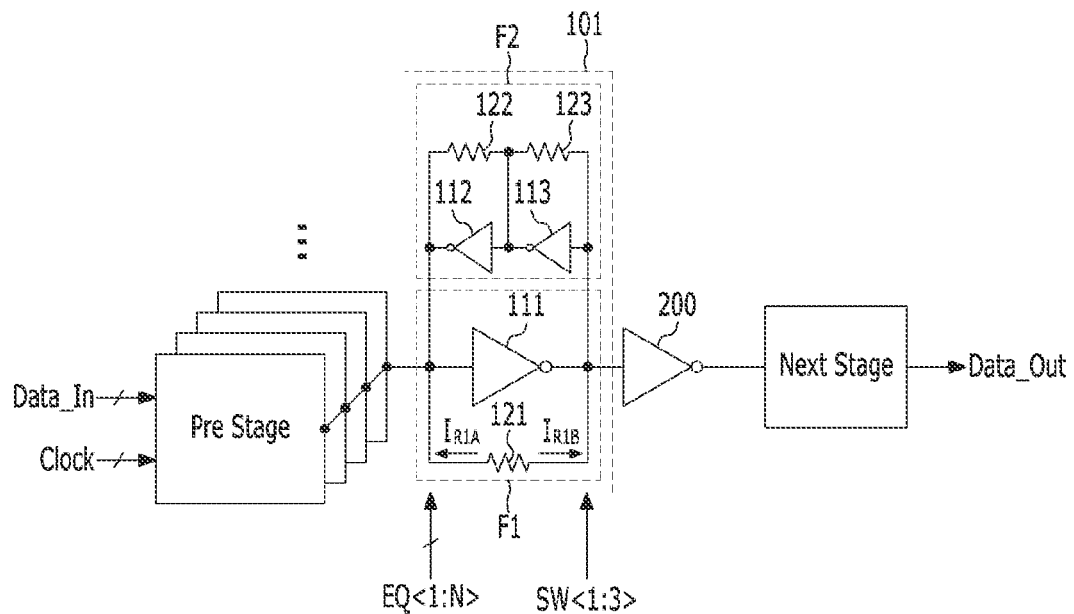
FIG. 4 is a diagram illustrating an operation of a signal transmission circuit in accordance with an embodiment of the present disclosure.
Figure 4:
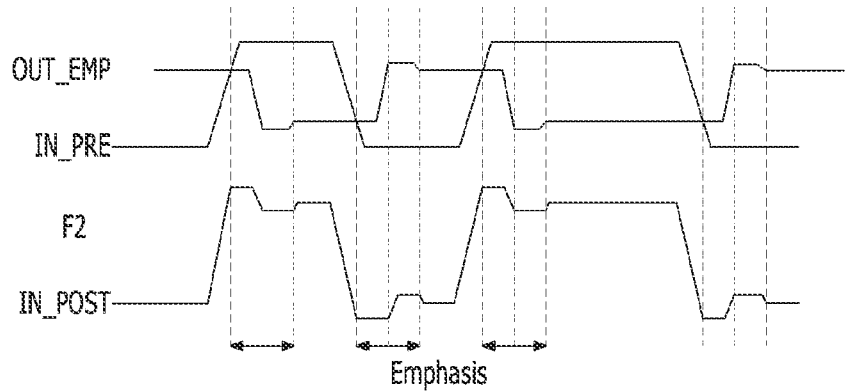
Figure 4:
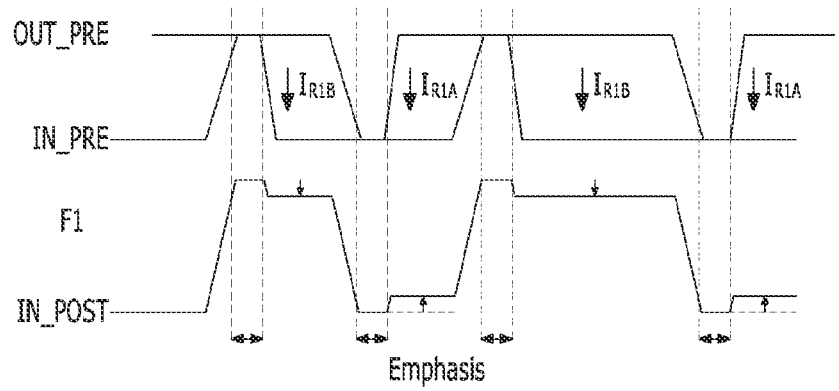

FIG. 4 is a view illustrating an operation of a signal transmission circuit in accordance with example embodiments.

Referring to FIG. 4, the signal transmission circuit 101 may perform the double emphasis operations, i.e., the first emphasis operation F1 and the second emphasis operation F2.

The first emphasis operation F1 may be performed by the first buffer unit 111 and the first resistance 121.

The input signal may be outputted through the first buffer unit 111. The input signal may be fed back into the first buffer unit 111 via the first resistance 121.

Current delayed by the input signal of the first buffer unit 111 pass through the first resistance 121 may be referred to as a first current IR1A. Current delayed by the output signal of the first buffer unit 111 pass through the first resistance 121 may be referred to as a second current IR1B.

A signal initially inputted into the signal transmission circuit 101 may be referred to as a pre-input signal IN_PRE. An output signal of the signal transmission circuit 101 in accordance with the pre-input signal IN_PRE may be referred to as a pre-output signal OUT_PRE. A feedback signal to the first buffer unit 111 through the first resistance 121 may be referred to as a post-input signal IN_POST.

The post-input signal IN_POST may have a waveform having a pre-emphasis by the first current IR1A and a de-emphasis by the second current IR1B.

The emphasis operation may be performed on the input signal of the signal transmission circuit 101. The emphasis operation may also be performed on the output signal of the signal transmission circuit 101 by the input signal IN_POST.

The second emphasis operation F2 may be performed by the second buffer unit 112, the third buffer unit 113, the second resistance 122, and the third resistance 123 together with the first emphasis operation F1.

The input signal may be outputted through the second buffer unit 112 and the third buffer unit 113. The input signal may be fed back into the second buffer unit 112 and the third buffer unit 113 via the second resistance 122 and the third resistance 123.

A signal generated by transmitting the initial input signal IN_PRE through the second buffer unit 112, the third buffer unit 113, the second resistance 122, and the third resistance 123 may be referred to as an emphasis output signal OUT_EMP. A signal generated by synthesizing the initial input signal IN_PRE and the emphasis output signal OUT_EMP may be referred to as a post-input signal IN_POST.

The post-input signal IN_POST may have a waveform having a pre-emphasis and a de-emphasis similarly to the first emphasis operation F1 by synthesizing the initial input signal IN_PRE and the emphasis output signal OUT_EMO.

The emphasis operation may be performed on the input signal of the signal transmission circuit 101. The emphasis operation may also be performed on the output signal of the signal transmission circuit 101 by the input signal IN_POST.

As mentioned above, the emphasis operation may be performed on the output signal of the signal transmission circuit 101 as well as the input signal of the signal transmission circuit 101 by the double emphasis operations.

FIG. 5 is a view illustrating a signal transmission circuit in accordance with example embodiments.

Referring to FIG. 5, a signal transmission circuit 102 may be connected between a first load and a second load. The first load may include a pre-stage. The second load may include a next stage.

The signal transmission circuit 102 may include a plurality of buffer units and a plurality of resistances. For example, the buffer units may include first to fourth buffer units 211-214. The resistances may include first to fourth resistances 221-224.

At least one of the first to fourth buffer units 211-214 may have an adjustable driving force by a driving force control signal EQ<1:N>.

An intensity of an emphasis operation may be controlled by adjusting the driving force of the at least one of the first to fourth buffer units 211-214.

The driving force of the first buffer unit 211 may be greater than the driving forces of the second to fourth buffer units 212-214.

The driving forces of the second to fourth buffer units 212-214 may be changed. A maximum driving force of the second to fourth buffer units 212-214 113 may be less than a default driving force of the first buffer unit 211.

At least one of the first to fourth resistances 221-224 may be connected or disconnected with/from a corresponding signal path by a switching control signal SW<1:4>.

At least one of the first to fourth resistances 221-224 may be connected or disconnected with/from the corresponding signal path to adjust a feedback time.

Values of the driving force control signal EQ<1:N> and the switching control signal SW<1:4> may be determined in accordance with operational characteristics of the signal transmission circuit 102. The values of the driving force control signal EQ<1:N> and the switching control signal SW<1:4> may be changed according to needs.

The driving force control signal EQ<1:N> and the switching control signal SW<1:4> may be programmed in a non-volatile storage device, for example, a fuse set.

The driving force control signal EQ<1:N> and the switching control signal SW<1:4> may be stored in a mode register set of a semiconductor device. The values of the driving force control signal EQ<1:N> and the switching control signal SW<1:4> may be changed by a mode register write operation.

The first buffer unit 211 may be connected between an input node of the signal transmission circuit 102 (hereinafter, referred to as an input node) and an output node of the signal transmission circuit 102 (hereinafter, referred to as an output node).

The second to fourth buffer units 212-214 may be connected to only the input node. The second buffer unit 212 may include an output terminal connected to the input node.

The third buffer unit 213 may include an output terminal connected to an input terminal of the second buffer unit 212.

The fourth buffer unit 214 may include an output terminal connected to an input terminal of the third buffer unit 213 and an input terminal connected to the input node.

The second to fourth buffer units 212-214 may have configurations substantially the same as those in FIG. 3.

The first resistance 221 may be parallely connected with the first buffer unit 211.

The second resistance 222 may be parallely connected with the second buffer unit 212.

The third resistance 223 may be parallely connected with the third buffer unit 213.

The fourth resistance 224 may be parallely connected with the fourth buffer unit 214.

The second resistance 222, the third resistance 223 and the fourth resistance 224 may be serially connected with each other.

The first buffer unit 211 and the first resistance 221 may form a first feedback loop configured to feed back the signal of the output node to the input node.

The second to fourth buffer units 212-214 and the second to fourth resistances 222-224 may form a second feedback loop configured to feed back of the signal of the output node to the input node.

Because each of the first to fourth resistances 221-224 may be parallely connected with the first to fourth buffer units 211-214, bandwidths of the input node and the output node in the signal transmission circuit 101 may be increased.

The first to fourth buffer units 211-214 and the first to fourth resistances 221-224 may be classified into an emphasis circuit and a delay circuit.

The emphasis circuit may feed back the signals of the input node and the output node to the input node to perform the emphasis operation with respect to the signals of the input node and the output node.

The emphasis circuit may include the first to fourth buffer units 211-214.

The delay circuit may be configured to control the feedback time by the emphasis circuit.

The delay circuit may include the first to fourth resistances 221-224.

The signal transmission circuit 102 may include the two feedback loops to perform the double emphasis operations. Thus, the first to fourth buffer units 211-214 and the first to fourth resistances 221-224 may be divided into a first emphasis circuit and a second emphasis circuit.

The first emphasis circuit may feed back the signal of the output node to the input node using a first feedback loop. The first emphasis circuit may perform a first emphasis operation with respect to the signals of the input node and the output node by adjusting the feedback time.

The first emphasis circuit may include the first buffer unit 211 and the first resistance 221.

The second emphasis circuit may be connected to the input node. The second emphasis circuit may feed back the signal of the input node to the input node using a second feedback loop. The second emphasis circuit may perform a second emphasis operation with respect to the signal of the input node by adjusting the feedback time.

The second emphasis circuit may include the second to fourth buffer units 212-214 and the second to fourth resistances 222-224.

An output of the signal transmission circuit 102 may be transmitted to the next stage via at least one buffer 200.

Numbers of the buffer 200 may be changed in accordance with phases of the output signal from the signal transmission circuit 102, a driving capacity of the signal transmission circuit 102, etc.

The buffer 200 may include an inverter configured to invert the input signal. Alternatively, the buffer 200 may have a configuration substantially the same as that of the signal transmission circuit 101 in FIG. 2 or a signal transmission circuit 102 in FIG. 5.

Figure 6:
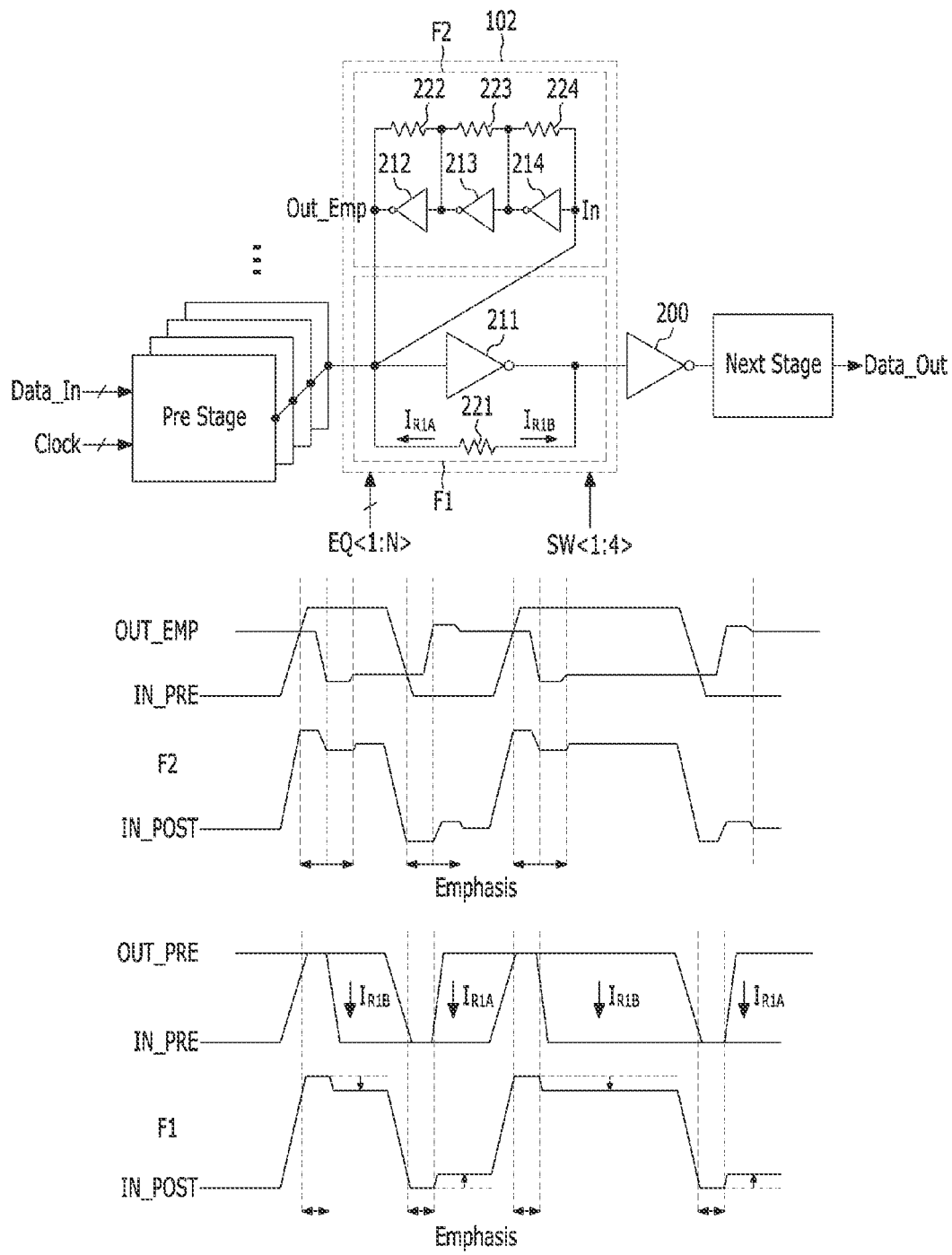
FIG. 6 is a diagram illustrating an operation of a signal transmission circuit in accordance with an embodiment of the present disclosure.

FIG. 6 is a view illustrating an operation of a signal transmission circuit in accordance with example embodiments.

Referring to FIG. 6, the signal transmission circuit 102 may perform the double emphasis operations, i.e., the first emphasis operation F1 and the second emphasis operation F2.

The first emphasis operation F1 may be performed by the first buffer unit 211 and the first resistance 221.

The input signal may be outputted through the first buffer unit 211. The input signal may be fed back into the first buffer unit 211 via the first resistance 221.

Delay currents generated by flowing the input signal and the output signal of the first buffer unit 211 through the first resistance 221 may be referred to as a first current IR1A and a second current IR1B.

A signal initially inputted into the signal transmission circuit 201 may be referred to as a pre-input signal IN_PRE. An output signal of the signal transmission circuit 102 in accordance with the pre-input signal IN_PRE may be referred to as a pre-output signal OUT_PRE. A feedback signal to the first buffer unit 211 through the first resistance 221 may be referred to as a post-Input signal IN_POST.

The post-input signal IN_POST may have a waveform having a pre-emphasis by the first current IR1A and a de-emphasis by the second current IR1B.

The emphasis operation may be performed on the input signal of the signal transmission circuit 102. The emphasis operation may also be performed on the output signal of the signal transmission circuit 102 by the input signal IN_POST.

The second emphasis operation F2 may be performed by the second to fourth buffer units 212-214 and the second to fourth resistances 222-224 together with the first emphasis operation F1.

The input signal may be outputted through the second to fourth buffer units 212-214. The input signal may be fed back into the second to fourth buffer units 212-214 via the second to fourth resistances 222-224.

A signal generated by transmitting the initial input signal IN_PRE through the second to fourth buffer units 212-214 and the second to fourth resistances 222-224 may be referred to as an emphasis output signal OUT_EMP. A signal generated by synthesizing the initial input signal IN_PRE and the emphasis output signal OUT_EMP may be referred to as a post-input signal IN_POST.

The post-input signal IN_POST may have a waveform having a pre-emphasis and a de-emphasis similarly to the first emphasis operation F1 by synthesizing the initial input signal IN_PRE and the emphasis output signal OUT_EMO.

The emphasis operation may be performed on the input signal of the signal transmission circuit 101. The emphasis operation may also be performed on the output signal of the signal transmission circuit 101 by the input signal IN_POST.

As mentioned above, the emphasis operation may be performed on the output signal of the signal transmission circuit 102 as well as the input signal of the signal transmission circuit 102 by the double emphasis operations.

The above-described embodiments of the present teachings are intended to be illustrative and not limiting. Various alternatives and equivalents are possible. The present teachings are not limited by the embodiments described herein. Nor are the present teachings limited to any specific type of semiconductor device. Other additions, subtractions, or modifications are possible in view of the present disclosure and are intended to fall within the scope of the appended claims.

What is claimed is:

1. A signal transmission circuit of a semiconductor device, the signal transmission circuit comprising:
   a first emphasis circuit configured to feed back a signal of an output node of the signal transmission circuit to an input node of the signal transmission circuit, the first emphasis circuit configured to perform a first emphasis operation with respect to a signal of the input node and the signal of the output node by adjusting a feedback time of the first emphasis circuit; and
   a second emphasis circuit connected in parallel with the first emphasis circuit between the input node and the output node, the second emphasis circuit configured to feed back the signal of the output node to the input node, the second emphasis circuit configured to perform a second emphasis operation with respect to the signals of the input node and the output node by adjusting a feedback time of the second emphasis circuit,
   wherein the first emphasis circuit comprises a first buffer unit connected between the input node and the output node; and a first resistance connected between the input node and the output node in parallel with the first buffer unit, and
   wherein the second emphasis circuit comprises a second buffer unit connected in parallel with the first buffer unit; and a second resistance connected in parallel with the second buffer unit.

2. The signal transmission circuit of claim 1, wherein at least one of emphasis intensities of the first emphasis circuit and the second emphasis circuit is controlled by a driving force control signal.

3. The signal transmission circuit of claim 2, wherein at least one of the feedback time of the first emphasis circuit and the feedback time of the second emphasis circuit is controlled by a switching control signal.

4. The signal transmission circuit of claim 3, wherein:
   the driving force control signal and the switching control signal have variable values; and
   the driving force control signal and the switching control signal are stored in the semiconductor device.

5. A signal transmission circuit of a semiconductor device, the signal transmission circuit comprising:
   a first emphasis circuit configured to feed back a signal of an output node of the first emphasis circuit to an input node of the first emphasis circuit, the first emphasis circuit configured to perform a first emphasis operation with respect to a signal of the input node of the first emphasis circuit and the signal of the output node of the first emphasis circuit by adjusting a feedback time of the first emphasis circuit; and
   a second emphasis circuit having an input node connected to the input node of the first emphasis circuit, the second emphasis circuit configured to feed back a signal of an output node of the second emphasis circuit to the input node of the second emphasis circuit, the second emphasis circuit configured to perform a second emphasis operation with respect to the signal of the input node of the second emphasis circuit by adjusting a feedback time of the second emphasis circuit.

6. The signal transmission circuit of claim 5, wherein at least one of emphasis intensities of the first emphasis circuit and the second emphasis circuit is controlled by a driving force control signal.

7. The signal transmission circuit of claim 6, wherein at least one of the feedback time of the first emphasis circuit and the feedback time of the second emphasis circuit is controlled by a switching control signal.

8. The signal transmission circuit of claim 7, wherein:
   the driving force control signal and the switching control signal have variable values; and
   the driving force control signal and the switching control signal are stored in the semiconductor device.

9. The signal transmission circuit of claim 5, wherein the first emphasis circuit comprises:
   a first buffer unit connected between the input node of the first emphasis circuit and the output node of the first emphasis circuit; and a first resistance connected between the input node of the first emphasis circuit and the output node of the first emphasis circuit in parallel with the first buffer unit.

10. The signal transmission circuit of claim 9, wherein the second emphasis circuit comprises:
   a second buffer unit connected to the input node of the second emphasis circuit; and
   a second resistance connected to the input node of the second emphasis circuit in parallel with the second buffer unit.

11. A signal transmission circuit of a semiconductor device, the signal transmission circuit comprising:
   an emphasis circuit configured to feed back a signal of an output node and/or an input node to the input node to perform a first emphasis operation with respect to the signals of the input node and the output node; and
   a delay circuit configured to control a feedback time of the emphasis circuit,
   wherein the emphasis circuit comprises a first buffer unit connected between the input node and the output node; and a second buffer unit configured to form a feedback loop for feeding back the signal of the input node to the input node.

12. The signal transmission circuit of claim 11, wherein an emphasis intensity of the emphasis circuit is controlled by a driving force control signal.

13. The signal transmission circuit of claim 12, wherein the feedback time of the delay circuit is controlled by a switching control signal.

14. The signal transmission circuit of claim 13, wherein:
   the driving force control signal and the switching control signal have variable values; and
   the driving force control signal and the switching control signal are stored in the semiconductor device.

15. The signal transmission circuit of claim 11, wherein the emphasis circuit comprises:
   a first buffer unit connected between the input node and the output node; and
   a second buffer unit connected in parallel with the first buffer unit.

16. The signal transmission circuit of claim 11, wherein the delay circuit comprises:
   a first resistance connected in parallel with the first buffer unit; and
   a second resistance connected in parallel with the second buffer unit.

17. The signal transmission circuit of claim 11, wherein the delay circuit comprises:
   a first resistance connected in parallel with the first buffer unit; and
   a second resistance connected in parallel with the second buffer unit.

* * * * *